(12) United States Patent
Rangasamy et al.

(10) Patent No.: US 7,676,773 B2
(45) Date of Patent: Mar. 9, 2010

(54) TRACE OPTIMIZATION IN FLATTENED NETLIST BY STORING AND RETRIEVING INTERMEDIATE RESULTS

(75) Inventors: Umesh Rangasamy, Jersey City, NJ (US); Srinidhi Adiga, Karnataka (IN)

(73) Assignee: LSI Corporation, Milpitas, CA (US)

( * ) Notice: Subject to any disclaimer, the term of this patent is extended or adjusted under 35 U.S.C. 154(b) by 393 days.

(21) Appl. No.: 11/724,143

(22) Filed: Mar. 14, 2007

(65) Prior Publication Data
US 2008/0229268 A1 Sep. 18, 2008

(51) Int. Cl.
G06F 17/50 (2006.01)
(52) U.S. Cl. .................................. 716/4; 716/7; 703/16
(58) Field of Classification Search ...................... 716/4, 716/7; 703/16
See application file for complete search history.

(56) References Cited

U.S. PATENT DOCUMENTS

| | | | | |
|---|---|---|---|---|
| 5,901,064 | A * | 5/1999 | Weber et al. .................. | 716/12 |
| 6,543,043 | B1 * | 4/2003 | Wang et al. ................... | 716/14 |
| 6,550,041 | B1 * | 4/2003 | McBride ....................... | 716/5 |
| 6,654,936 | B2 * | 11/2003 | McBride ....................... | 716/5 |
| 6,799,309 | B2 * | 9/2004 | Dhanwada et al. ............. | 716/8 |
| 6,886,140 | B2 * | 4/2005 | Regnier ........................ | 716/1 |
| 7,272,805 | B2 * | 9/2007 | McGaughy et al. ............. | 716/3 |
| 2004/0111687 | A1 * | 6/2004 | Dhanwada et al. ............. | 716/8 |
| 2006/0112356 | A1 * | 5/2006 | McGaughy et al. ............. | 716/3 |
| 2007/0044051 | A1 * | 2/2007 | McGaughy et al. ............. | 716/5 |
| 2008/0216040 | A1 * | 9/2008 | Furnish et al. ................ | 716/10 |

OTHER PUBLICATIONS

Shiran, "YNCCdb: A New Database Representation of VLSI Circuits for Fast Navigation and Layout Verification Applications", Design: Concepts, Methods and Tools, CompuEuro '88, Apr. 11-14, 1988, pp. 150-155.*

* cited by examiner

*Primary Examiner*—Phallaka Kik
(74) *Attorney, Agent, or Firm*—Christopher P. Maiorana, PC

(57) ABSTRACT

A method of trace optimization in a flattened netlist of a circuit is disclosed. The method generally includes the steps of (A) generating a first total result by tracing a first path through the flattened netlist, (B) writing an intermediate result in a memory, the intermediate result characterizing a module having a plurality of instances in the circuit, (C) adding the intermediate result as read from the memory to the first total result upon crossing each of the instances of the module along the first path and (D) writing the first total result into the memory.

21 Claims, 7 Drawing Sheets

PATH1:
102
1. b61_in2
2. b61_b11_i1/ | b11_in2
3. b61_b11_i1/ | b11_a2_1/A1
4. b61_b11_i1/ | b11_a2_1/Z
5. b61_b11_i1/ | b11_mux2_1/D1
6. b61_b11_i1/ | b11_mux2_1/Z
7. b61_b11_i1/ | b11_out1
8. b61_out1

PATH2:
104
1. b61_in4
2. b61_b11_i2/ | b11_in2
3. b61_b11_i2/ | b11_a2_1/A1
4. b61_b11_i2/ | b11_a2_1/Z
5. b61_b11_i2/ | b11_mux2_1/D1
6. b61_b11_i2/ | b11_mux2_1/Z
7. b61_b11_i2/ | b11_out1
8. b61_out2

140

142
CONSTRUCT TREE OF CIRCUIT FROM OBJECTS IN DATA BASE

144
IDENTIFY INPUT PORTS AND OUTPUT PORTS

146
TRACE EACH PATH FROM INPUT PORTS TO OUTPUT PORTS

FIG. 4

TRACE OPTIMIZATION IN FLATTENED NETLIST BY STORING AND RETRIEVING INTERMEDIATE RESULTS

FIELD OF THE INVENTION

The present invention relates to netlist tracing generally and, more particularly, to trace optimization in flattened netlists by storing and retrieving intermediate results.

BACKGROUND OF THE INVENTION

Tracing a hierarchical netlist is a popular routine used in conventional Electronic Design Automation (EDA) applications. Conventional netlist tracing applications analyze a circuit by stepping along a path through the netlist from a starting point to an ending point. The analysis evaluates the circuit at each node along the path independently of any prior analyses performed at an earlier node. As a result, the conventional tracing applications often duplicate efforts when the path crosses several instances of a block of circuitry.

SUMMARY OF THE INVENTION

The present invention concerns a method of trace optimization in a flattened netlist of a circuit. The method generally comprises the steps of (A) generating a first total result by tracing a first path through the flattened netlist, (B) writing an intermediate result in a memory, the intermediate result characterizing a module having a plurality of instances in the circuit, (C) adding the intermediate result as read from the memory to the first total result upon crossing each of the instances of the module along the first path and (D) writing the first total result into the memory.

The objects, features and advantages of the present invention include providing an architecture and/or method of trace optimization in a flattened netlist by storing and retrieving intermediate results that may (i) optimize a trace operation, (ii) utilize a module level abstraction of a netlist, (iii) consume fewer computational resources to evaluate a circuit compared with conventional techniques, (iv) reduce processing time and/or (v) leverage a hierarchical order of the netlist.

BRIEF DESCRIPTION OF THE DRAWINGS

These and other objects, features and advantages of the present invention will be apparent from the following detailed description and the appended claims and drawings in which:

FIG. 4 is a flow diagram of an example method for netlist tracing in accordance with a preferred embodiment of the present invention.

DETAILED DESCRIPTION OF THE PREFERRED EMBODIMENTS

Figure 1:
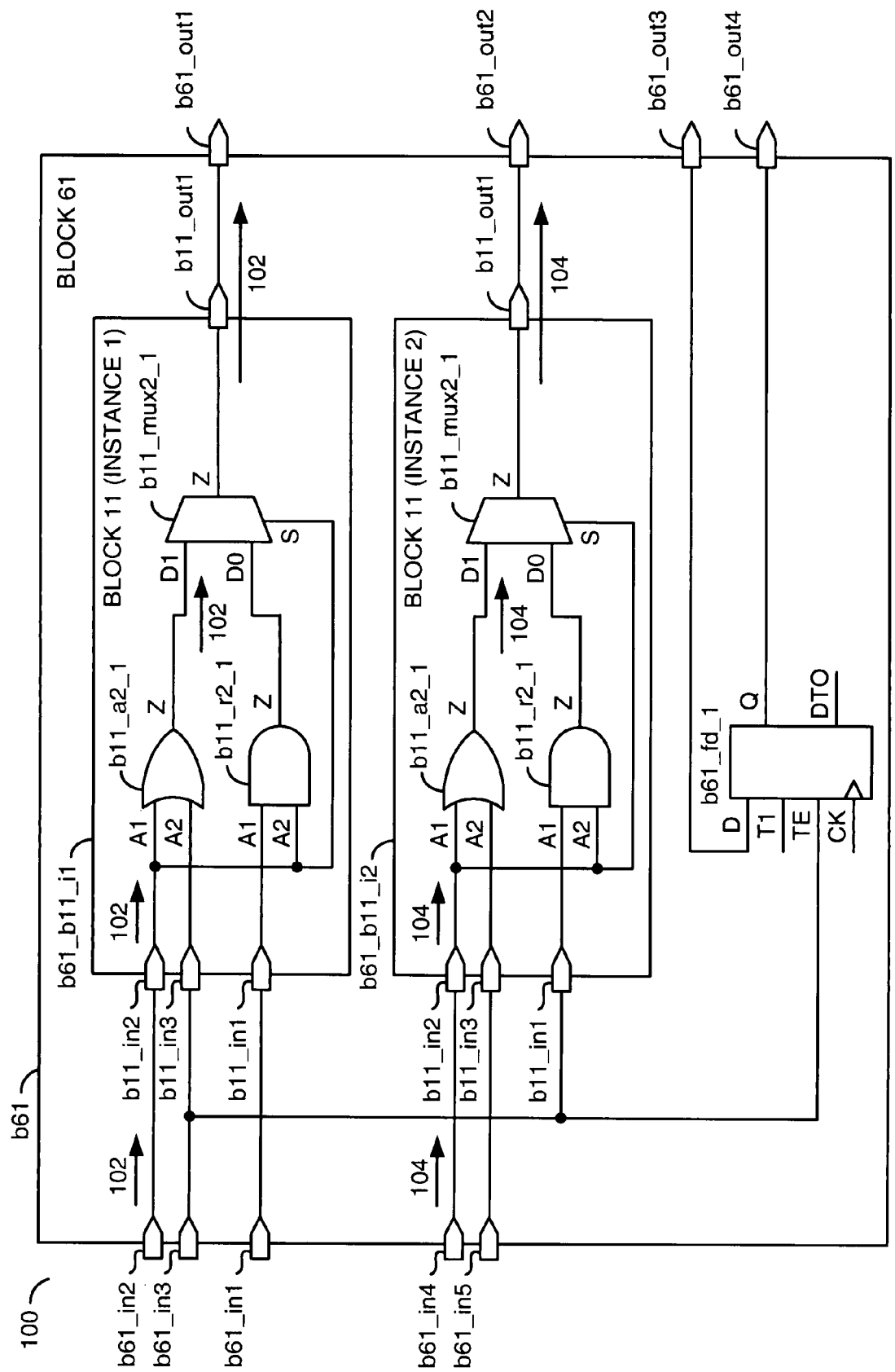
FIG. 1 is a block diagram of an example circuit being evaluated.

Referring to FIG. 1, a block diagram of an example circuit 100 being evaluated is shown. The circuit 100 may be designated as a block (e.g., BLOCK 61 or b61) at a particular level of a hierarchical netlist of the circuit 100. The block b61 generally comprises a first block (or module), a second block (or module) and a third block (or module). The first module, the second module and the third module may reside at a next lower level in the hierarchical netlist of the circuit 100. In the example show, the first module and the second module may be copies of a particular block (e.g., BLOCK 11 or b11). Hence, the first module may be a first instance (e.g., i1) of the block b11 and thus designated as b61_b11_i1. The second module may be a second instance (e.g., i2) of the block b11 and thus designated as b61_b11_i2. The third module may be a unique module (e.g., fd_1) and thus designated as b61_fd_1.

The block b61 may have one or more input ports (e.g., b61_in1 through b61_in5) and one or more output ports (e.g., b61_out1 through b61_out4). The port b61_in1 may be connected in the netlist to an input port (e.g., b11_in1) of the module b61_b11_i1. The port b61_in2 may be connected in the netlist to an input port (e.g., b11_in2) of the module b61_b11_i1. The port b61_in3 may be connected to all of (i) an input port (e.g., b61_b11_in3) of the module b61_b11_i1, (ii) an input port (e.g., b61_b11_in1) of the module b61_b11_i2 and (iii) a toggle-enable port (e.g., TE) of the module b61_fd_1. The port b61_in4 may be connected to an input port (e.g., b11_in2) of the module b61_b11_i2. The port b61_in5 may be connected to an input port (e.g., b11_in3) of the module b61_b11_i2.

An output port (e.g., b11_out1) of the module b61_b11_i1 may be connected by the network to the port b61_out1. The output port b11_out1 of the module b61_b11_i2 may be connected in the network to the port b61_out2. A port (e.g., D) of the module b61_fd_1 may be connected to the port b61_out3. A port (e.g., Q) of the module b61_fd_1 may be connected to the port b61_out4.

Figure 2:
FIG. 2 is a list of two example paths through the circuit.

Referring to FIG. 2 a list of two example paths through the circuit 100 is shown. An example tracing operation through the block b61 may follow a path 102 and a path 104. The path 102 may start at the node b61_in2 and end at the mode b61_out1. The path 102 generally crosses through the first instance of the module b11 (e.g., through b61_b11_i1). The path 104 generally crosses through the second instance of the module b11 (e.g., through b61_b11_i2). As the figure shows, some intermediate sections of both paths 102 and 104 may be repetitive given that both the module b61_b11_i1 and the module b61_b11_i2 are instances of the same module b11.

The present invention may characterize the module b61_b11_i1 upon an initial encounter with the module b11 at the node b61_b11_i1/b11_in2 while tracing the path 102. A calculated intermediate result from the initial encounter may be written into a memory. The intermediate result is generally specific to the underlying module, not the instances, such that the intermediate result is deduced only once per module. For example, as the path 102 is deduced, the intermediate path result (for the path section within the rectangle) may be stored and tied to the module b11. Hence, the intermediate result is not deduced again when the path 104 is examined. Instead the intermediate result may be retrieved from the memory as previously stored.

The deduce, store and retrieve approach may provide a performance improvement in an overall trace operation time. Consider an example path having Ni instances of Mi respective modules for i=1 to j. A common trace may use (N1×M1)+ (N2×M2)+ . . . +(Nj×Mj)+C amount of time, where the parameter C may be a constant representing a time corresponding to a leaf cell in the given modules. In contrast, the optimized trace per the present invention may take (M1+

M2+ . . . +Mj+C)+(j×B)+(A×(N1+N2+ . . . +Nj)) amount of time, where the parameter A may be the time taken to retrieve the stored path from a memory and the parameter B may be the time taken to store the path in the memory. Considering that the parameter A and the parameter B are generally very small, a performance improvement ratio of ((N1×M1)+(N2×M2)+ . . . +(Nj×Mj)+C)/(M1+M2+ . . . +Mj+C) may be realized.

The netlist information is generally stored in a database. An Open Access database may be an example of a suitable database. The Open Access database is generally an object-oriented database wherein the modules, the ports and the instances may be represented as objects. Additional information regarding Open Access may be found on the Silicon Integration Initiative, Inc. website at http://www.si2.org/openaccess.

Figure 3:
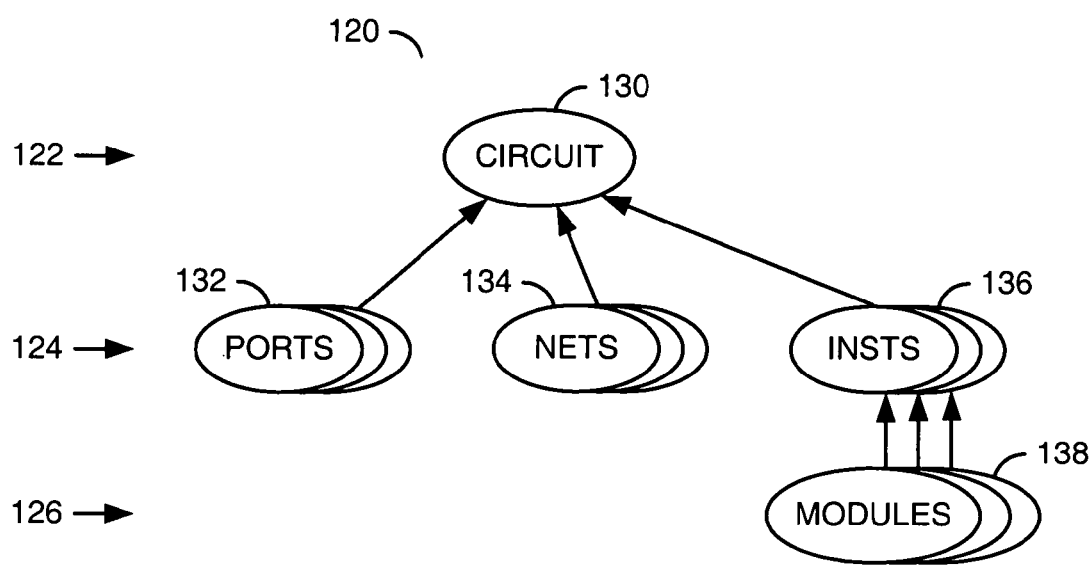
FIG. 3 is a diagram of an example tree of a hierarchical netlist.

Referring to FIG. 3, a diagram of an example tree 120 of a hierarchical netlist is shown. The tree 120 may comprise a first level 122, a second level 124 and a third level 126. In practice other numbers of levels may be implemented to meet the criteria of a particular application. When a trace operation is done, the tree 120 may be constructed with the various input nodes and output nodes being a net object or a pin object. A root of the tree is generally one of the ports of the circuit, block or module corresponding to the trace. In a particular embodiment, extensions in Open Access may allow for the tree construction. The end ports (e.g., input ports and output ports) may also be identified in order to continue the trace operation.

The level 122 may represent a top level of a module (or block or circuit) 130. The level 124 may include one or more objects 132, 134 and 136 that make up the top-level object 130. In some embodiments, the objects 132 may comprise one or more input ports and one or more output ports. The objects 134 generally comprise multiple nets connecting the ports 132 with each other and other modules. The objects 136 generally comprise one or more instances of modules. Each of the instances 138 may be based on an underlying module (or sub-module) object 138.

Referring to FIG. 4, a flow diagram of an example method 140 for netlist tracing is shown in accordance with a preferred embodiment of the present invention. The method (or process) 140 generally comprises a step (or block) 142, a step (or block) 144 and a step (or block) 146.

In the step 142, a tree for all, or a portion, of a circuit may be constructed. The tree generally comprises multiple ports, multiple nets, multiple pins (or nodes) and one or more instances of other modules. An input port (or ports) corresponding to the path (or paths) may define a root of the tree. An output port (or ports) may define the end (or ends) of the path (or paths). As such, the relevant input ports and the relevant output ports of the circuit may be identified in the step 144. Thereafter, a trace may be performed for each path of interest starting from the appropriate input ports and ending at the appropriate output ports in the step 146.

Figure 5:
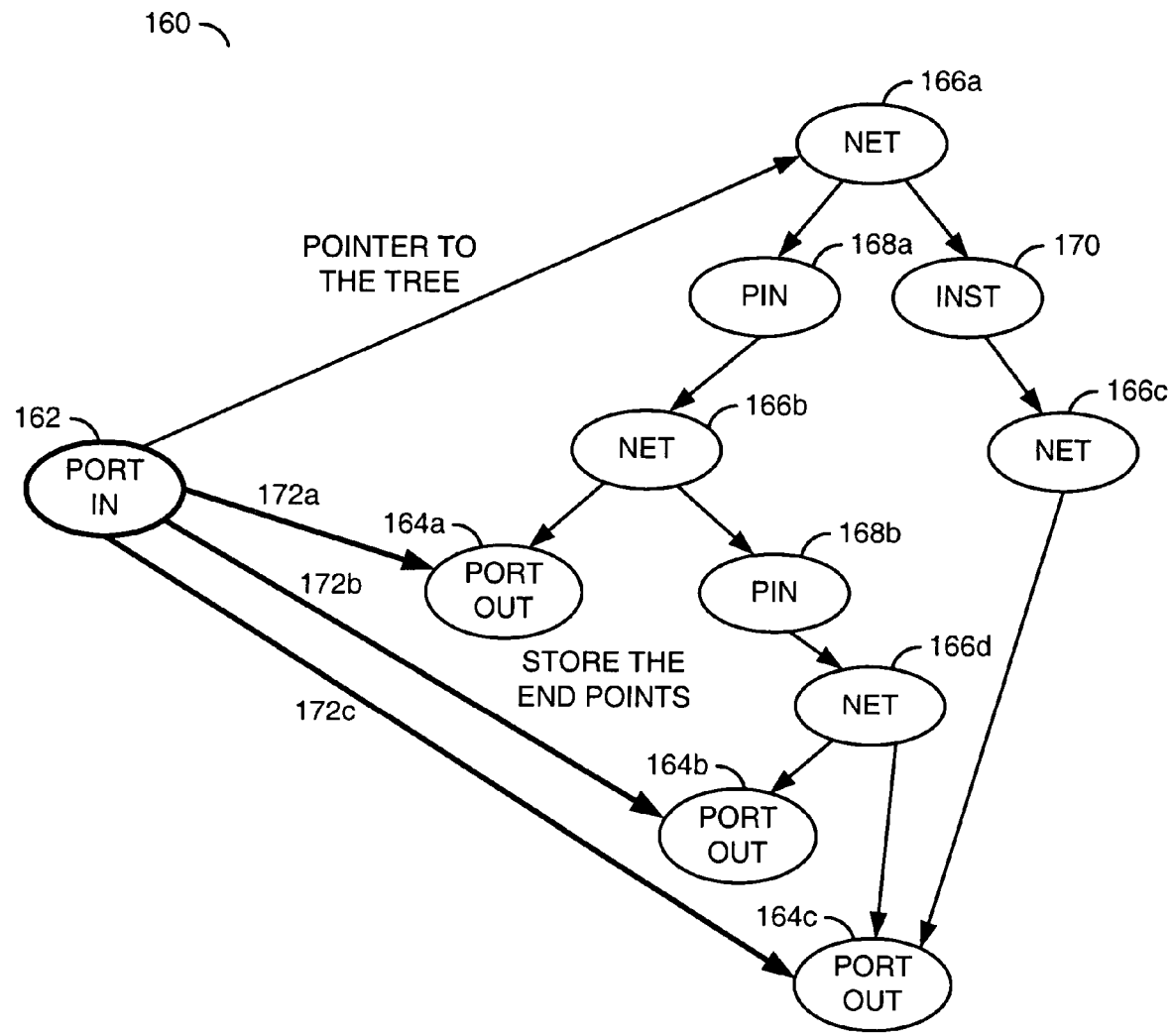
FIG. 5 is a diagram of an example tree.

Referring to FIG. 5, a diagram of an example tree 160 is shown. The example tree generally comprises an input port 162, multiple output ports 164a-164c, multiple nets 166a-166d, multiple pins 168a-168b and a module instance 170. The pins generally identify pins and/or nodes along the various paths. The nets may identify connections between the ports, pins, nodes and instances.

The ports 162 and 164a-164c generally define several (e.g., three) paths 172a-172c of the circuit that may be characterized. The first path 172a generally starts at the port 162 and routes through the net 166a to the pin 168a, then through the net 166b to the output port 164a. The second path 172b may start at the input port 162 and pass through the node 166a, the pin 168a, the net 166b, the pin 168b, the net 166d and end at the output port 164b. The third path 172c may start from the input port 162 and split in the net 166a into two branches. A first branch may continue through the pin 168a, the net 166b, the pin 168b the net 166d and end at the output port 164c. The second branch may trace from the net 166a to the instance 170, the net 166c and finally to the output port 164c.

Figure 6:
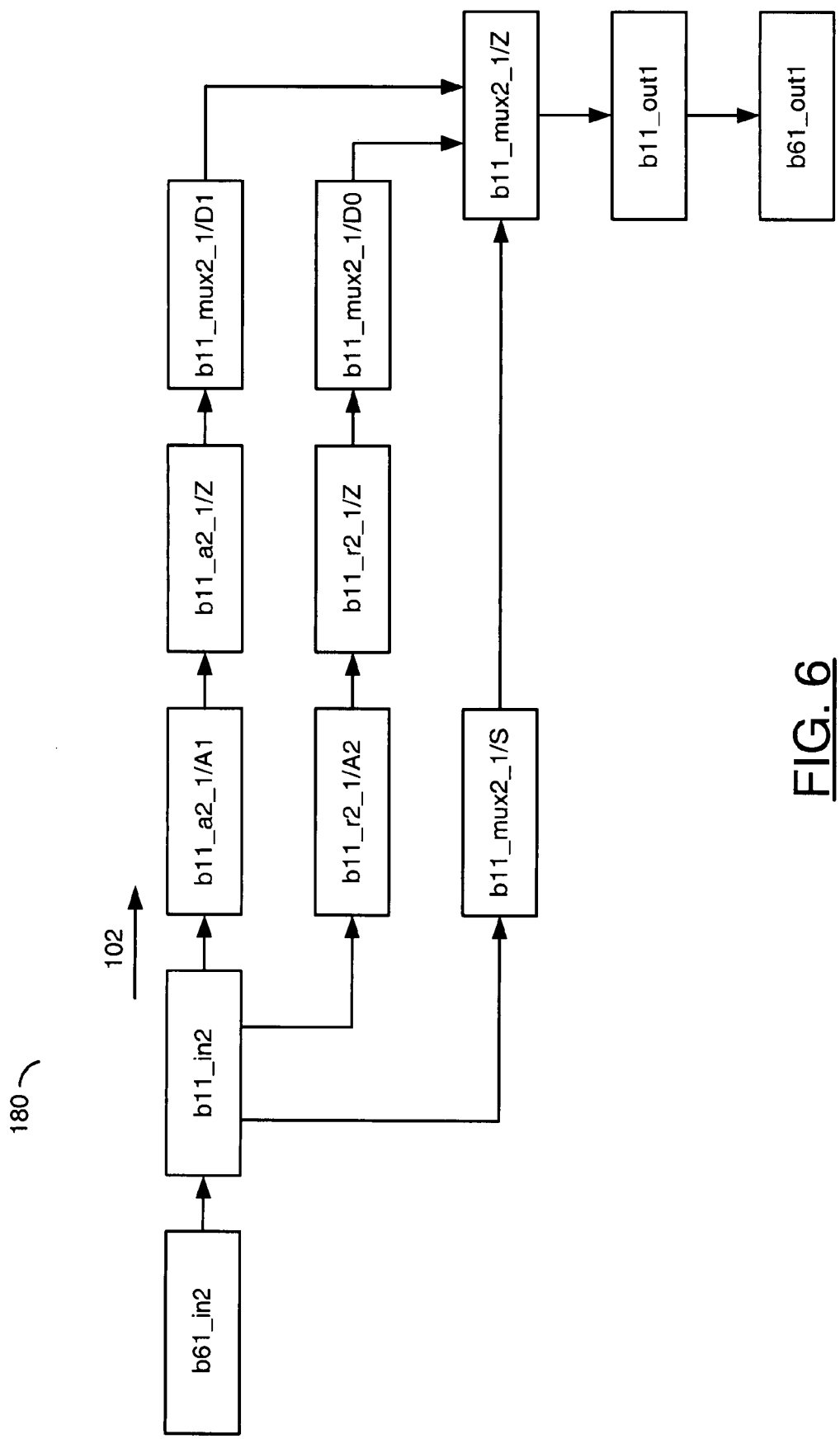
FIG. 6 is a diagram of a tree of the example circuit.

Referring to FIG. 6, a block diagram of an example tree 180 of the circuit 100 is shown. The example trace 180 generally includes the path 102 from FIG. 1. The other paths between the port b61_in2 and the output port b61_out1 are also shown.

During the first trace, a tree may be created having the port b61_in2 as the root. The trace generally follows the path 102 to the pin b11_in2, into the AND gate pin b11_a2_1/A1, out of the AND gate pin b11_a2_1/Z, to the MUX pin b11_mux2_1/D1, out of the MUX pin b11_mux2_a/Z, through the pin b11_out1 and ending at the port b61_out1.

The present invention may recognize the pin b11_in2 and the pin b11_out1 as the boundaries of an instance of the module b11. As such, in the first pass along the path 102, the characterization of the module instance b61_b11_i1 may be captured as an intermediate result. During a second trace through the circuit b61 along the path 104, when the trace reaches the module instance b61_b11_i2 (see FIG. 1), the intermediate result of the module b11 characterization may be retrieved from memory instead of analyzing the entire module instance b61_b11_i2. Afterwards, the intermediate result may be added to the path 104 total result and the trace continues from the mode b11_out1 to the output port b61_out2.

The optimization of the present invention may be useful (and easy to implement) in delay calculations and constant propagation kind of applications where the functionality along the path through an instance is not important. Instead, the end points and the characterization value (e.g., delay) between the end points may be calculated and stored in a memory for the initial instance.

Figure 7:
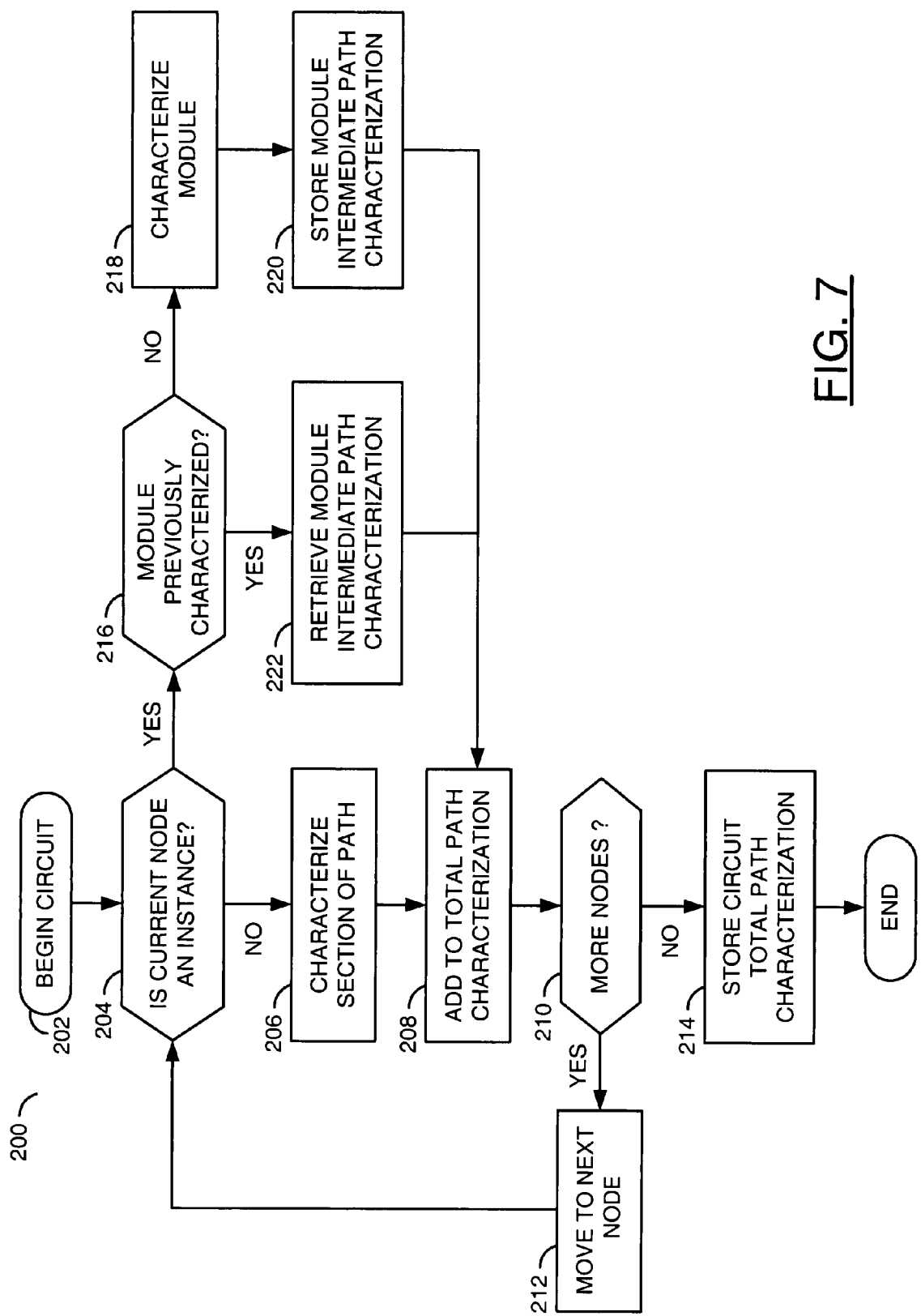
FIG. 7 is a flow diagram of an example method of characterizing.

Referring to FIG. 7, a flow diagram of an example method 200 of characterizing is shown. The method (or process) 200 generally comprises a step (or block) 202, a step (or block) 204, a step (or block) 206, a step (or block) 208, a step (or block) 210, a step (or block) 212, a step (or block) 214, a step (or block) 216, a step (or block) 218, a step (or block) 220 and a step (or block) 222.

The method 200 may begin in the step 202 reading a netlist from a file and identifying a starting port. In the step 204, a check is made to see if a current node is an input for an instance of a module that repeats in the circuit. If the current node is not part of an instance (e.g., the NO branch of step 204), the section of the path between the current node and a next node may be characterized in the step 206. A section result generated by the characterization may be added to the total result of the path in the step 208.

In the step 210 a check is made to see if an end port has been reached. If the end has not been reached (e.g., the YES branch of step 210), the trace may continue along the path by moving to the next node in the step 212. Thereafter, the next node is treated as the current node and the process continues by evaluating the current node in the step 204. If the next node is the last node (e.g., the NO branch of step 210), the total result may be stored in a memory in the step 214 and the method 200 ended.

Where the current node is an input to a module instance (e.g., the YES branch of step 204), a check may be made in the step 216 to see if the instance was previously characterized. If the instance is not characterized (e.g., the NO branch of step 216), the module may be characterized in the step 218. The module characterization may be performed using normal tracing techniques or using the method 200. Once the intermediate result is known, the intermediate result may be stored in the memory in the step 220. Thereafter, the intermediate result may be added to the total result in the step 208.

If the module instance had been previously characterized (e.g., the YES branch of step 216), the method 200 may simply read the intermediate result from the memory in the step 222. Afterwards, the intermediate result may be added to the total result in the step 208. As a result, each time an instance of the characterized module is encountered, processing cycles and time consumed by the trace may be saved by reading the intermediate result from the memory in place of analyzing each new instance of the module.

Figure 8:
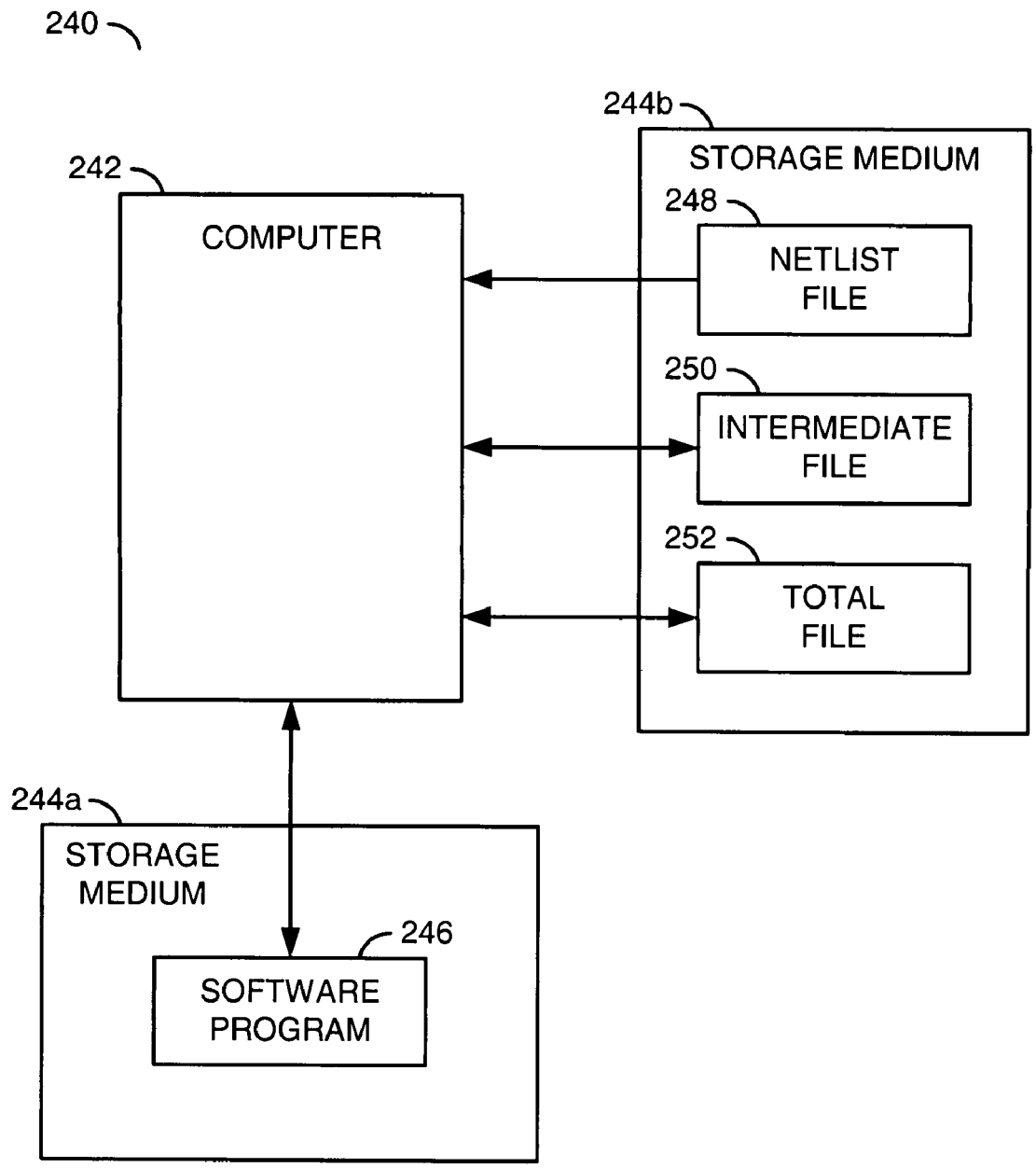
FIG. 8 is a block diagram of an example implementation of a system.

Referring to FIG. 8, a block diagram of an example implementation of a system 240 is shown. The system 240 may be operational to implement the method 140 and/or the method 180. The system (or apparatus) 240 generally comprises a computer (or processor) 242 and one or more storage media (or memories) 244a-244b. A storage medium 244a may store a software program 246 readable and executable by the computer 242. The software program 246 may define the steps of the optimized tracing process. The storage medium 244b may hold a file 248, a file 250 and a file 252. The file 248 may contain the netlist of a circuit being evaluated by the software program 246. The file 250 may store the intermediate results generated before and/or during the evaluation. The file 252 may hold the total result of the evaluation. In some embodiments, the software program 246, the file 248, the file 250 and the file 252 may be stored in the same storage medium.

The function performed by the flow diagrams of FIGS. 4 and 7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMS, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A method of trace optimization in a flattened netlist of a circuit, comprising the steps of:
   (A) generating a first total result by tracing a first path through said flattened netlist;
   (B) writing an intermediate result in a computer storage memory, said intermediate result characterizing a module having a plurality of instances in said circuit; and
   (C) adding said intermediate result as read from said computer storage memory to said first total result upon crossing each of said instances of said module along said first path.

2. The method according to claim 1, further comprising the steps of:
   generating a second total result by tracing a second path through said flattened netlist; and
   adding said intermediate result as read from said computer storage memory to said second total result upon crossing each of said instances of said module along said second path.

3. The method according to claim 1, further comprising the step of:
   checking whether a current node on said first path is an input node to a current one of said instances.

4. The method according to claim 3, further comprising the step of:
   determining if said module was previously characterized.

5. The method according to claim 4, further comprising the step of:
   generating said intermediate result by characterizing said current instance where said current instance comprises an initial occurrence along said first path.

6. The method according to claim 1, further comprising the step of:
   calculating a section result by characterizing a section of said first path where a current node in not one of said instances.

7. The method according to claim 6, further comprising the step of:
   adding said section result to said first total result without reading an earlier evaluation of said section result from said computer storage memory.

8. The method according to claim 1, wherein said intermediate result comprises a delay through said module.

9. The method according to claim 1, wherein said intermediate result comprises a propagation through said module.

10. The method according to claim 1, further comprising the step of:
    writing said first total result into said computer storage memory.

11. A computer storage medium recording a computer program, when executed by a computer, causes said computer to implement the steps of claim 1.

12. A system comprising:
    a memory; and
    a processor configured to (i) generate a first total result by tracing a first path through a flattened netlist of a circuit, (ii) write an intermediate result into said memory, said intermediate result characterizing a module having a plurality of instances in said circuit and (iii) add said intermediate result as read from said memory to said first total result upon crossing each of said instances of said module along said first path.

13. The system according to claim 12, wherein said processor is further configured to (i) generate a second total result by tracing a second path through said flattened netlist and (ii) add said intermediate result as read from said memory to said second total result upon crossing each of said instances of said module along said second path.

14. The system according to claim 12, wherein said processor is further configured to check whether a current node on said first path is an input node to a current one of said instances.

15. The system according to claim 14, wherein said processor is further configured to determine if said module was previously characterized.

16. The system according to claim 15, wherein said processor is further configured to generate said intermediate result by characterizing said current instance where said current instance comprises an initial occurrence along said first path.

17. The system according to claim 12, wherein said processor is further configured to calculate a section result by characterizing a section of said first path where a current node in not one of said instances.

18. The system according to claim 17, wherein said processor is further configured to add said section result to said first total result without reading an earlier evaluation of said section result from said memory.

19. The system according to claim 12, wherein said intermediate result comprises a delay through said module.

20. The system according to claim 12, wherein said intermediate result comprises a propagation through said module.

21. A system comprising:
   means for storing; and
   means for (i) generating a first total result by tracing a first path through a flattened netlist of a circuit, (ii) writing an intermediate result in said means for storing, said intermediate result characterizing a module having a plurality of instances in said circuit and (iii) adding said intermediate result as read from said means for storing to said first total result upon crossing each of said instances of said module along said first path.

* * * * *